United States Patent [19]
Konishi et al.

[11] 3,943,550
[45] Mar. 9, 1976

[54] LIGHT-ACTIVATED SEMICONDUCTOR-CONTROLLED RECTIFIER

[75] Inventors: Nobutake Konishi; Tsutomu Yatsuo; Tatsuya Kamei; Masahiro Okamura; Takuzo Ogawa, all of Hitachi, Japan

[73] Assignee: Hitachi, Ltd., Japan

[22] Filed: Dec. 19, 1974

[21] Appl. No.: 534,373

[30] Foreign Application Priority Data
Dec. 24, 1973 Japan.............................. 48-143486
Jan. 7, 1974 Japan................................ 49-4966

[52] U.S. Cl. ....................... 357/38; 357/20; 357/30; 357/39; 357/86
[51] Int. Cl.² ......................................... H01L 29/74
[58] Field of Search .............. 357/20, 38, 39, 30, 86

[56] References Cited
UNITED STATES PATENTS

| | | | |
|---|---|---|---|
| 3,409,810 | 11/1968 | Matzen ................................ | 357/38 |
| 3,422,323 | 1/1969 | Whoriskey ............................ | 357/39 |
| 3,719,863 | 3/1973 | Ogawa et al. .......................... | 357/38 |
| 3,818,370 | 6/1974 | Abe et al. .............................. | 357/38 |

Primary Examiner—Andrew J. James
Assistant Examiner—Joseph E. Clawson, Jr.
Attorney, Agent, or Firm—Craig & Antonelli

[57] ABSTRACT

A light-activated semiconductor-controlled rectifier device comprising four layers of PNPN is disclosed in which a part of the edges of the PN junction formed between the intermediate P-type layer and the intermediate N-type layer is exposed on the same side on which the outer P-type layer is exposed, so that a photo-trigger signal is radiated on that exposed part of the edges of the PN junction.

8 Claims, 11 Drawing Figures

LIGHT-ACTIVATED SEMICONDUCTOR-CONTROLLED RECTIFIER

The present invention relates to a light-activated type semiconductor-controlled rectifier device which performs a switching operation in response to a photo-trigger signal.

A light-activated type semiconductor-controlled rectifier device which, for example, exhibits bidirectional switching characteristics comprises a semiconductor substrate having 5 continuous layers of alternately different conductivity type and included two controlled rectifier regions, in parallel opposed arrangement, which comprise four layers and have an end layer respectively formed by one or the other of the two outer layers of the 5 continuous layers; a pair of main electrodes in ohmic contact with the outer layer and intermediate layers adjacent thereto; and means for supplying a trigger signal. In such a device, when a trigger signal is supplied in a state that a voltage is applied between the main electrodes so that first of the main electrodes is at higher potential than the second and one controlled rectifier region is biased forwardly, that region begins to turn on. On the other hand, when a trigger signal is supplied in a state that a voltage 3 is applied between the main electrodes so that a second main electrode is at higher potential than the first main electrode and the other controlled-rectifier region is biased forwardly, that region begins to turn on.

The most common type of means for supplying a trigger signal is what is called the electric gate system in which one of the layers of the semiconductor substrate is provided with a gate electrode from which a gate signal current is supplied to perform a switching operation of the device. The electric gate system, however, has the following disadvantages: (1) If a symmetric bidirectional switching characteristic is to be obtained, it is necessary to provide two gate electrodes, thereby requiring two electrically isolated gate circuits; (2) In the event that only one gate electrode is involved, there is a risk of what is called erroneous-firing whereby a conduction state is realized prior to application of a gate signal current at the time of commutation, due to the fact that the gate electrode is disposed in proximity to the two four-layer regions, on that part of a main surface which overlaps part of the outer layer exposed to the opposite main surface when taking a phantom view of the layer lamination in the direction of thickness; (3) when only one gate electrode is involved, it is difficult to obtain a symmetric switching characteristic; (4) In order to prevent interference between the two controlled rectifier regions, the two controlled rectifier regions are formed in such a manner that their outer layers are in spaced relation with each other when viewed in the direction of layer lamination, by providing an isolating three-layer region between the controlled rectifier regions. This necessitates two gate electrodes, leading to a disadvantage like that of (1) above; (5) There is a likelihood of erroneous-firing due to induction. By reason of these disadvantages of the electric gate system, the conventional semiconductor-controlled rectifier devices having bidirectional switching characteristics are limited to fields of applications requiring neither high reliability nor a high rated value of current or voltage.

The above-mentioned disadvantages of the semiconductor-controlled rectifier device employing an electric gate system and having bidirectional switching characteristics are obviated by employing a photo-gate system in which the device is fired with a photo-trigger signal radiated thereon. According to the photo-gate system, two four-layer regions electrically isolated from each other can be fired by a single light source electrically insulated from the regions. In spite of this, the semiconductor-controlled rectifier device employing the photo-gate system having bidirectional switching characteristics has the disadvantage of unbalance in firing sensitivity between the two four-layer regions. In firing the four-layer regions by means of a photo-trigger signal, the regions where carriers are generated for effective firing are located in the vicinity of the reverse-biased center junctions, that is, the PN junctions formed between the intermediate P-type layers and the intermediate N-type layer. The photo-trigger signal is required to be radiated so as to reach the vicinity of the center junctions, if the firing-sensitivity is to be improved. In the case where the two four-layer regions are to be fired by light radiated from one of the main surfaces of the semiconductor substrate, the distance between the light-receiving surface and the reverse-biased center junctions where carriers effective for firing the four-layer regions are generated is different for the two four-layer regions by the thickness of the center layer of the five layers. In other words, light required for firing the four-layer region having a center junction farther from the light receiving surface is attenuated as an expotential function by being absorbed into the center layer, with the result that the photo-firing sensitivity of that particular four-layer region is much lower than that of the four-layer region having the center junction nearer to the light-receiving surface. In order to obviate this disadvantage, a photo-firing type semiconductor-controlled rectifier device has been suggested in which the edges of the center junctions of the two four-layer regions are exposed to a side surface of the semiconductor substrate which connects the two main surface thereof, so that a light-trigger signal is radiated on the side surface. Even this type of light-activated semiconductor-controlled rectifier device has the following disadvantages: (1) For operating the device stably, the exposed edges of the PN junctions must be covered with a surface-passivating film of such a material as a semiconductor oxide, glass or resin. Since the step of forming the surface-passivating film on the side surface usually follows the step of forming electrodes in the semiconductor substrate, it is required to form the passivating film in a condition not adversely affecting the electrodes. Taking into consideration the availability of materials for the electrodes, the most suitable material of the surface-passivating film includes such a resin as silicon rubber, followed by glass. A film of a semiconductor oxide, which is formed by chemical vapor deposition or by sputtering, is porous and not suitable for surface passivation. As to glass, it may be usable depending on what material is selected for the electrodes, even though heat treatment is necessary in an oxidating atmosphere. It is difficult to make a thin passivating film of resin or glass, and such a film formed on the light-receiving surface may undesirably lead to a lower photo-sensitivity. (2) The photo-trigger signal should most preferably be radiated at right angles to the light-receiving surface in view of minimum loss due to reflection. In the case where a side surface is used as a light-receiving surface, it is necessary to determine the position of the light source in accordance with the shape of the side surface, and for this reason a special structure is required of the coupling between the light source and the light-activated semiconductor-controlled rectifier device. This adds to trouble for adjusting the structure. (3) Light is received at two or more points on the side surface, thus requiring a light source of large capacity having a large radiating area or two or more light sources.

Apart from the light-activated type semiconductor-controlled rectifier device having bidirectional switching characteristics, two light-activating type semiconductor-controlled rectifier devices each switching in one direction in response to a photo-trigger signal may be arranged in proximity in different directions of switching to provide bidirectional switching characteristics. The means of this type has the same problem as encountered by the light-activated type semiconductor-controlled rectifier device having the bidirectional switching characteristics except for the problem of interference between the adjacent four-layer regions.

Accordingly, it is an object of the present invention to provide a light-activated type semiconductor-controlled rectifier device which performs switching operation in response to a photo-trigger signal without any of the above-mentioned disadvantages.

Another object of the invention is to provide a light-activated type semiconductor-controlled rectifier device high in photo-firing sensitivity.

Still another object of the invention is to provide a light-activated type semiconductor-controlled rectifier device suitable as the one having bidirectional switching characteristics.

A still further object of the invention is to provide a light-activated type semiconductor-controlled rectifier device which is easily coupled with a light source generating a photo-trigger signal.

Still another object of the invention is to provide a light-activated type semiconductor-controlled rectifier device with a large current capacity.

Still another object of the invention is to provide a light-activated type semiconductor-controlled rectifier device applicable to various fields of use.

According to the present invention, there is provided a light-activated type semiconductor-controlled rectifier device comprising a semiconductor substrate having at least a region of four-layers of alternately different conductivity between a couple of main surfaces, a couple of main electrodes in ohmic contact with the main surfaces respectively, means for radiating a photo-trigger signal onto one of the main surfaces, and means for causing a photo-current produced by radiation of the photo-trigger signal to flow in such a manner as to effectively forward-bias the PN junction formed between the outer layer exposed to the other main surface and an intermediate layer adjacent thereto. More specifically, the present invention is characterized in that the intermediate layer adjacent to an outer layer is exposed to the opposite main surface of the semiconductor substrate, that a photo-trigger signal is radiated on the exposed portion of the intermediate layer, and that the photo current produced by radiation of the photo-trigger signal is made to flow toward a point spaced from the short-circuiting point of the PN junction between the outer layer and the intermediate layer adjacent thereto, so that the photo-current flows along that PN junction in the neighborhood of the above-mentioned point toward which it flows.

The above and other objects, features and advantages will be made apparent by the detailed description taken in conjunction with the accompanying drawings, in which.

Figure 1:
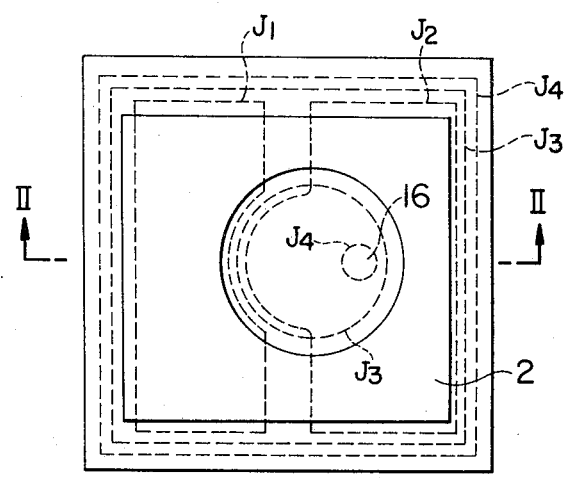
FIG. 1 is a plan view showing a first embodiment of the light-activated type semiconductor-controlled rectifier device according to the present invention.
Figure 2:
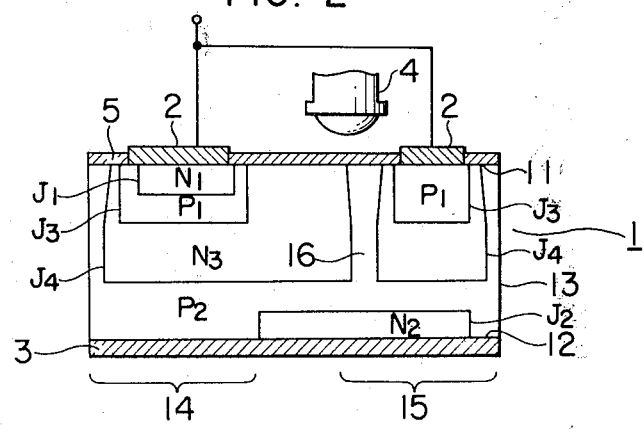
FIG. 2 is a sectional view taken in line II—II in FIG. 1.

Referring to FIG. 1 and FIG. 2 showing a first embodiment of the light-activated type semiconductor-controlled rectifier device according to the present invention, reference numeral 1 shows a semiconductor substrate having a pair of main surfaces 11 and 12 oppositely located and a side surface 13 connecting the main surfaces. The semiconductor substrate 1 has five layers arranged in succession in such a manner that every adjacent pair of layers has different conductivity between the two main surfaces. The five layers include a first outer layer $N_1$ of N-type conductivity exposed to a main surface 11, a second outer layer $N_2$ of N-type conductivity exposed to the other main surface 12, a first intermediate layer $P_1$ of P-type conductivity which is partially exposed to the main surface 11 and adjacent to the first outer layer $N_1$, forming a first PN junction $J_1$ with the first oute layer $N_1$, a second intermediate layer $P_2$ of P-type conductivity which is partially exposed to the main surface 12 and adjacent to the second outer layer $N_2$, forming a second PN junction $J_2$ with the second outer layer $N_2$, and a third intermediate layer $N_3$ of N-type conductivity located between the first and second intermediate layers and forming third and fourth PN junctions $J_3$ and $J_4$ respectively between them. The first and second outer layers $N_1$ and $N_2$ are so formed as to overlap only slightly, or preferably not to overlap at all, when viewed from the direction of the layer lamination, whereby a couple of four-layer regions 14 and 15 including $N_1P_1N_3P_2$ and $P_1N_3P_2N_2$ respectively and having opposite polarities are defined between the two main surfaces. The first and second outer layers function as end layers of the two regions respectively, while the first, second and third intermediate layers function as the remaining three layers of the regions. A part of the second intermediate layer $P_2$ is exposed to the main surface 11 by penetrating through the third intermediate layer $N_3$ in a substantially central portion of the substrate between the two four-layer regions 14 and 15. Due to the exposure of the second intermediate layer $P_2$ to the main surface 11, the ends of the third PN junction $J_3$ and fourth PN junction $J_4$ are exposed around the second intermediate layer $P_2$. That side of the part 16 of the second intermediate layer $P_2$ penetrating through the third intermediate layer $N_3$ which is opposite to the second outer layer $N_2$ is located substantially at the center of the substrate in spaced relation with the ends of the second PN junction $J_2$. The second outer layer $N_2$ is formed not to overlap the first intermediate layer $P_1$ of the four-layer region 14 when viewed from the direction of lamination. Reference numeral 2 shows a first main electrode in ohmic contact with the surfaces of the first outer layer $N_1$ and first intermediate layer $P_1$ in the main surface 11, numeral 3 a second main electrode in ohmic contact with the surfaces of the second outer layer $N_2$ and second intermediate layer $P_2$ in the main surface 12, and numeral 4 a light source for radiating a photo-trigger signal on the portions of the third and fourth PN junctions $J_3$ and $J_4$ exposed to the main surface 11. The light source 4 may comprise a solidstate light-emitting element such as a light-emitting diode disposed in proximity to the semiconductor substrate, or may be an external light source introduced by way of a window provided on the side of a package containing the semiconductor device. Another alternative may be to use a fiberscope or other light-transmitting member for radiation of light. Further, the first and second outer layers may be of short-circuited emitter construction, as required. Reference numeral 5 shows an oxide film covering that part of the main surface 11 which is not in contact with the first main electrode.

The light-activated semiconductor-controlled rectifier device as mentioned above can be fabricated by selective diffusion. For example, P-type impurities are diffused from both sides of an N-type silicon plate while masking those portions of the third intermediate layer which are expected to be exposed, followed by diffusion of N-type impurities by masking those portions of the first, second and third intermediate layers which are to be exposed, thus producing a semiconductor substrate having the required junction structure. The device as shown in FIGS. 1 and 2 is obtained by subsequent formation of the main electrodes by, say, evaporation or plating.

The operation of the device shown in FIGS. 1 and 2 will be described below.

First, reference will be made to the case in which a voltage is applied between the main electrodes in such a manner that the potential of the main electrode 2 is negative as compared with the main electrode 3, so that the first and fourth PN junctions $J_1$ and $J_4$ are forward biased and the third PN junction $J_3$ reverse-biased. When light energy $h\nu$(where $h$ is Plank's constant, and $\nu$ frequency of light) generated by the light source 4 is radiated on the portion of the third PN junction $J_3$ which is exposed to the main surface 11, electron-hole pairs are produced in the vicinity of the exposed portion of the third PN junction $J_3$. The electrons are collected at the third intermediate layer $N_3$ and the holes at the first intermediate layer $P_1$. The holes collected at the first intermediate layer $P_1$ cause the potential of the first intermediate layer $P_1$ to be gradually reduced. When the voltage applied to the first PN junction $J_1$ at the right edge thereof exceeds the built-in voltage, electrons begin to be injected at that point from the first outer layer $N_1$ into the first intermediate layer $P_1$. The electrons injected into the first intermediate layer $P_1$ are diffused in the third intermediate layer $N_3$ through the third PN junction $J_3$, whereupon the potential of the third intermediate layer $N_3$ is increased.

When the bias voltage of the fourth PN junction $J_4$ is increased beyond the built-in voltage, holes are injected from the second intermediate layer $P_2$ into the third intermediate layer $N_3$, which holes are diffused into the first intermediate layer $P_1$ from the third intermediate layer $N_3$, thereby forward-biasing the first PN junction $J_1$, with the result that injection of the electrons from the first outer layer $N_1$ is promoted. When after repetition of the above-mentioned processes the sum of the current amplification factors $\alpha$PNP+$\alpha$NPN of the two transistor equivalents exceeds unity, the four-layer region 14 begins to conduct.

Figure 3:
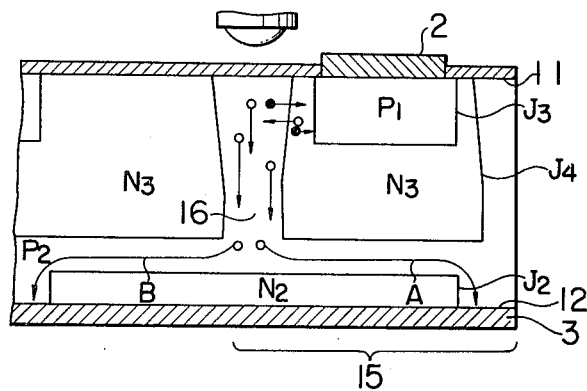
FIG. 3 is a partially enlarged sectional view of FIG. 2.

Next, explanation will be made of the case in which the second and third PN junctions $J_2$ and $J_3$ are forward biased while the fourth PN junction $J_4$ is reverse-biased as the result of applying between the main electrodes such a voltage that the potential of the main electrode 2 is positive against the main electrode 3. When light is radiated on the portions of the fourth PN junction $J_4$ which are exposed to the main surface 11, the four-layer region 15 enters a conducting state. The firing operation under this condition will be described in detail with reference to FIG. 3.

Of the electrons and holes produced in the fourth PN junction $J_4$ in the vicinity of the main surface 11 by the radiation of light, the holes indicated by white circles are collected at the second intermediate layer $P_2$ and the electrons indicated by black dots at the third intermediate layer $N_3$. The holes collected at the second intermediate layer $P_2$ flow by way of the through section 16 toward the main surface 12, and near the second outer layer $N_2$, laterally along the second PN junction $J_2$. As a result, the potential of the second intermediate layer $P_2$ drops. When the voltage applied to the second PN junction $J_2$ at the point thereof corresponding to the left end of the first intermediate layer $P_1$ exceeds the built-in voltage, electrons begin to be injected from the second outer layer $N_2$ into the second intermediate layer $P_2$. The electrons thus injected into the second intermediate layer $P_2$ are diffused into the third intermediate layer $N_3$. The potential of the third intermediate layer $N_3$ rises and the bias voltage of the third PN junction $J_3$ exceeds the built-in voltage, with the result that holes are injected from the first intermediate layer $P_1$ into the third intermediate layer $N_3$, which holes are then diffused in the second intermediate layer $P_2$ thereby to forward bias the second PN junction $J_2$. As a result, the injection of electrons from the second outer layer $N_2$ into the second intermediate layer $P_2$ is promoted. When after the repetition of the above-mentioned processes the sum of the current amplification factors $\alpha$NPN+$\alpha$PNP of the two transistor equivaleents exceeds unity, the other four-layer region 15 enters a conducting state. In this way, the conduction of the four-layer region 15 occurs with the injection of the electrons from the second outer layer $N_2$ into the second intermediate layer $P_2$ as a motive. The injection of electrons from the second outer layer $N_2$ into the second intermediate layer $P_2$ is atrributable to the fact that the photo-current caused by the radiation of a photo-trigger signal flows laterally in the path A along the second PN junction $J_2$ in the second intermediate layer $P_2$, so that the resulting voltage drop causes the second PN junction $J_2$ to be forward biased. The conduction of the four-layer region 15 occurs when the amount of the electrons injected from the second outer layer $N_2$ into the second intermediate layer $P_2$ exceeds a predetermined level. The amount of electrons injected from the second outer layer $N_2$ into the second intermediate layer $P_2$ is substantially proportional to the degree to which the second PN junction $J_2$ is forward biased. The degree to which the second PN junction $J_2$ is forward biased is dependent on the amount of the voltage drop caused by the lateral flow of photo current along the path A in the second intermediate layer $P_2$. The amount of the voltage drop due to the photo current, on the other hand, is proportional to the length of path A along which the photo current flows. Consequently, if the photo-firing sensitivity of the four-layer region 15, that is, the degree of how easily it is fired by a small photo-trigger signal, is to be increased, it is necesssary to lengthen the path A along which the photo current flows laterally in the second intermediate layer $P_2$. For this purpose, that side of the through section 16 of the second intermediate layer which faces the second outer layer $N_2$ should preferably be opposed to the center of the second outer layer $N_2$, as shown in the drawing. Even though the second PN junction $J_2$ is also forward biased by the photo current component flowing in the path B, it is difficult for this current component to effect the firing for lack of the first intermediate layer $P_1$ corresponding to the forward-biased portion of second PN junction $J_2$. In the event that the impedance of the path B is very small as compared with the path A, the firing sensitivity is deteriorated as most of the photo current flows through the path B. To prevent such a condition, it is necessary that most of the photo current flow in the path A. Further, in the case where there is formed in the outer layer $N_2$ a short-circuiting aperture through which the second intermediate layer $P_2$ is brought into contact with the second main electrode 3 in order to improve the durability against the voltage increase rate $vd/dt$ and against high temperatures, the outer layer $N_2$ side of the through section 16 should preferably be opposed to the short-circuiting aperture.

As will be understood from the foregoing description, the light-activated type semiconductor-controlled rectifier device according to the present invention is so constructed that the center junctions of the two four-layer regions arranged adjacent to each other are exposed to the same surface of the substrate between the two four-layer regions, thereby making possible the switching operation of the two four-layer regions by radiating a photo-trigger signal on the same surface of the substrate. Also, according to the present invention, the length of the lateral path of the photo current for firing the four-layer region farther from the light source is lengthened in the second intermediate layer, and therefore the firing sensitivity of that particular four-layer region is increased almost to that of the other four-layer region, thus making possible the switching operation of the two four-layer regions at substantially the same firing sensitivity. This is atrributable to the fact that a photo-trigger signal which otherwise might be considerably attenuated in the semiconductor substrate is converted into an electrical signal subjected to less attenuation while flowing through the semiconductor substrate to a predetermined destination and that the surface-passivating film covering the light-receiving surface of the substrate is made of a very thin semiconductor oxide film. Further, the device according to the present invention is characterized by a very small area of photo-trigger signal radiation, making it possible to use a very small light source such as a GaAs light-emitting element. Furthermore, the invention is such that the energization current is greater since a couple of main electrodes are in ohmic contact with the two main surfaces located on the opposite sides of the substrate. In addition, in view of the fact that the light-receiving surface is included in one of the main surfaces of the substrate, the photo-trigger signal from the light source acts on the substrate with little loss.

Figure 4:
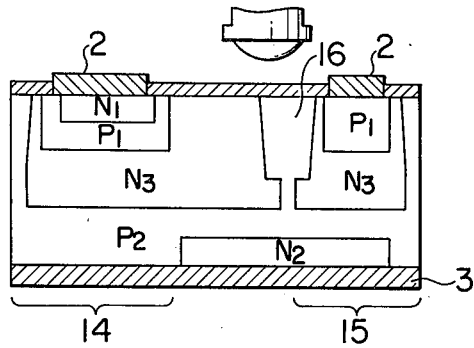
FIG. 4 is a sectional view showing a second embodiment of the invention.
Figure 5:
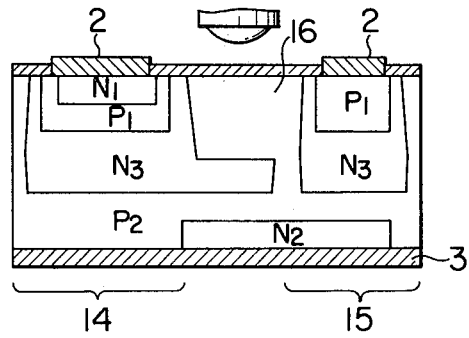
FIG. 5 is a sectional view showing a third embodiment of the invention.

In the second and third embodiments shown respectively in FIG. 4 and FIG. 5, the area of the portion of the second intermediate layer $P_2$ which is exposed to the main surface 11 is increased in an attempt to improve the firing sensitivity of the four-layer region 15 as compared with the first embodiment. In other words, by enlarging the area of that portion of the second intermediate layer $P_2$ which is exposed to the main surface 11, electron-hole pairs effective for firing are generated over a wider area in response to a photo-trigger signal radiation and the resulting increased photo-trigger current contributes to an improved firing sensitivity derived from one photo-trigger signal. In spite of this, the outer layer $N_2$ side of the through section 16 is rendered smaller in area than the exposed side thereof and is opposed to substantially the center of the second outer layer. Referring to the embodiment shown in FIG. 5, the center of the second outer layer side of the through section 16 is relocated toward the side of the four-layer region 15 away from the center of the exposed side thereof in order to promote the lateral flow of the photo-trigger current from substantially the center of the second outer layer $N_2$.

Figure 6:
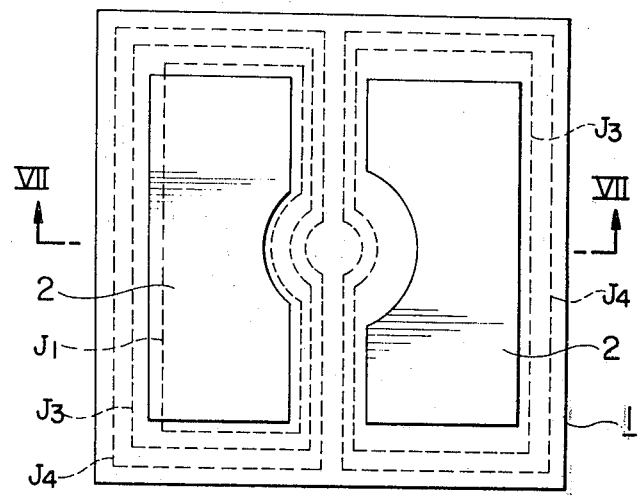
FIG. 6 is a plan view showing a fourth embodiment of the invention.
Figure 7:
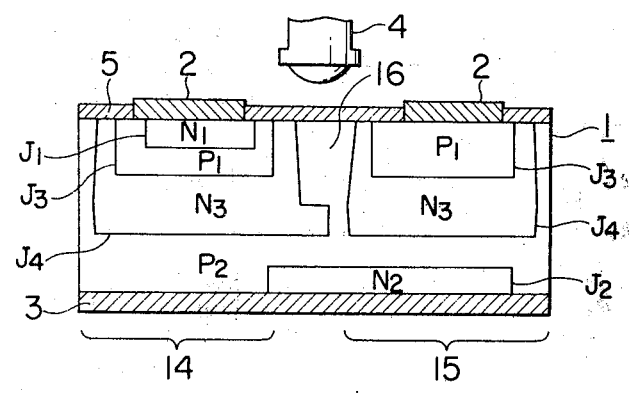
FIG. 7 is a sectional view taken in line VII—VII in FIG. 6.

A fourth embodiment of the invention is shown in FIG. 6 and FIG. 7. This embodiment provides a light-activated type semiconductor-controlled rectifier device which is less likely to be erroneously fired at the time of commutation than the first embodiment. The reference numerals denote like component elements as in the first embodiment. In the first embodiment, the two four-layer regions are separated by the second intermediate layer $P_2$ in the section of the substrate exposed to the photo-trigger signal shown in FIG. 2 whereas they are constructed continuously with respect to the first, second and third intermediate layers in the other sections. In such a construction of the first embodiment, when the four-layer region 14 is conducting, for example, electric charges stored in the conducting region are likely to flow out at the four-layer region 15 side of the first outer layer $N_1$ due to the commutation, with the result that the four-layer region 15 may be erroneously fired into a conducting state by the electric charges before being radiated by the photo-trigger signal. This erroneous firing is facilitated even more at a high rise rate $dv/dt$ of the applied voltage, at a great load current or at a high current reduction rate $di/dt$ in a conducting state. Therefore, the first embodiment is suitably applied to the cases involving a low rise rate $dv/dt$ of the applied voltage, a comparatively small load current or a low current reduction rate $di/dt$.

Turning back to the fourth embodiment, the second intermediate layer $P_2$ is extended into the whole interface between the four-layer regions 14 and 15, so that the first intermediate layer $P_1$, third intermediate layer $N_3$, third PN junction $J_3$ and the fourth PN junction $J_4$ are divided into two sections, thereby completely separating the two four-layer regions 14 and 15 by the second intermediate layer $P_2$. This construction prevents the above-mentioned erroneous firing encountered by the first embodiment, since charges stored in the conducting region during the period when the four-layer region 15 is conducting are prevented from flowing out into the vicinity of the first PN junction $J_1$ of the four-layer region 14 due to the commutation. Also, since the main electrode 2 disposed on the substrate side radiated with the photo-trigger signal is divided into two sections, dispersion of photo current produced by radiation of light is prevented, thus improving the photo sensitivity of the device.

Figure 8:
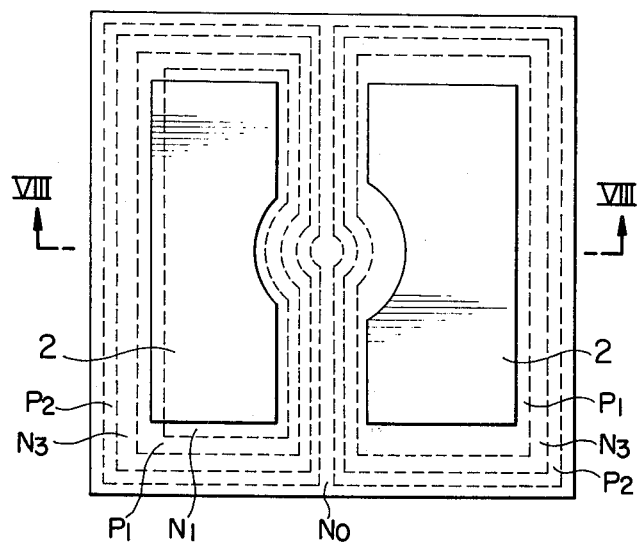
FIG. 8 is a plan view showing a fifth embodiment of the invention.
Figure 9:
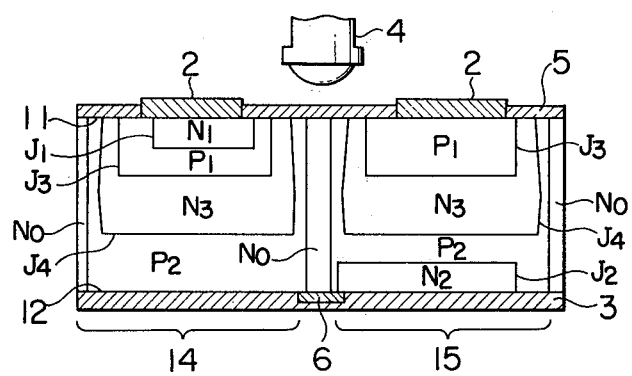
FIG. 9 shows a sectional view taken in line VIII—VIII in FIG. 8.

In the fifth embodiment illustrated in FIGS. 8 and 9, the two four-layer regions 14 and 15 are separated from each other by forming an isolating region $N_0$ of N-type conductivity which is opposite to the conductivity of the second intermediate layer $P_2$, in the extension of the second intermediate layer $P_2$ in the fourth embodiment. In the drawings under consideration, the four-layer regions 14 and 15 are completely surrounded by the isolating region $N_0$. This complete separation of the four-layer regions permits the problem of erroneous firing due to the commutation to be obviated without fail, making possible a light-activated type semiconductor-controlled rectifier device suitable for the applications requiring a large current capacity and high speed. Further, the fact that dispersion of photo current is prevented results in an improved firing sensitivity. In FIGS. 8 and 9, reference numeral 6 shows an oxide film for covering the portion of the surface of the isolating region $N_0$ exposed to the main surface 12 and those exposed portions of the PN junction between second outer layer $N_2$ and second intermediate layer $P_2$ which are situated between the two four-layer regions. In the presence of the oxide film 6, all the photo current flows from left to right in the drawings along the second PN junction $J_2$, thereby effectively forward biasing the second PN junction $J_2$.

Figure 10:
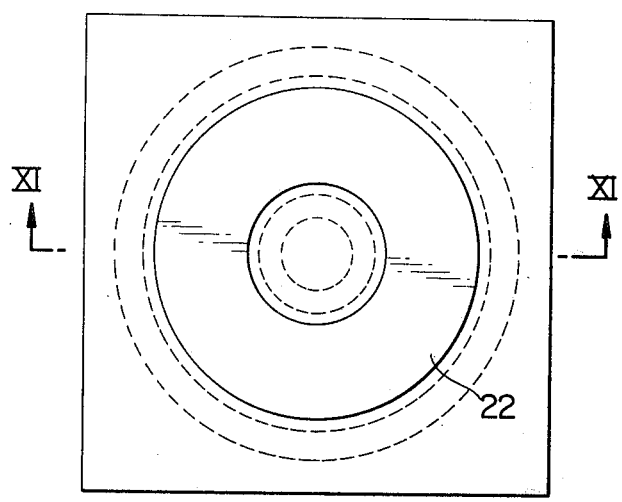
FIG. 10 is a plan view showing a sixth embodiment of the invention.
Figure 11:
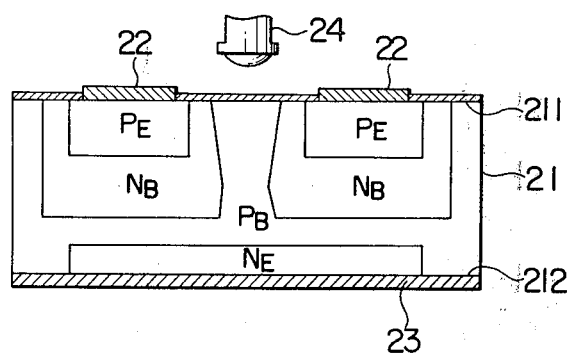
FIG. 11 is a sectional view taken in line XI—XI in FIG. 10.

Referring to the light-activated type semiconductor-controlled rectifier device shown in FIG. 10 and FIG. 11, a sixth embodiment of the invention is provided with four continuous layers of $P_E N_B P_B N_E$ which exhibit a switching characteristic in one direction in response to a photo-trigger signal. Of the four layers $P_E$, $N_B$, $P_B$ and $N_E$ formed between a couple of main surfaces, at least $P_E$ and $N_B$ layers are exposed to one of the main surfaces while at least $N_E$ layer is exposed to the other main surface. Further, part of the $P_B$ layer is exposed to the former main surface through $N_B$ and $P_E$ layers. That side of the $P_B$ layer which is nearer to the latter main surface is opposed to substantially the center of the $N_E$ layer, while a photo-trigger signal is radiated on the side of the $P_B$ layer exposed to the through section of $P_B$ layer exposed to the former main surface. It is possible by this construction to obtain a device having the same firing characteristics for the two four-layer regions as in the embodiments already mentioned. Reference numeral 21 shows a semiconductor substrate, numerals 211 and 212 the two main surfaces, numerals 22 and 23 a couple of main electrodes, and numeral 24 a light source.

Next, the advantages of the present invention will be described below by reference to specific numerical values.

In the conventional light-activated type semiconductor-controlled rectifier device in which the center junctions of the two four-layer regions are not exposed to the same main surface of the substrate in proximity to each other, the light source output of 20mW is required for firing one four-layer region and 200mW for the other four-layer region. In the present invention, by contrast, it is found that the same wattage is required to fire the former region, while the latter four-layer region was successfully fired with only 25mW. Also, in terms of the maximum voltage increasing rate $dv/dt$ and maximum current decreasing rate $di/dt$ at which the device is not erroneously fired at the time of commutation, they are $5V/\mu s$ and $10A/ms$ for the conventional device of 3A and 200V employing the electric gate system, respectively, as compared with $500V/\mu s$ or more and $100A/\mu s$ or more respectively for the device according to the invention of the rated voltage of 600V and rated current of 30A respectively and having the construction shown in FIGS. 8 and 9.

What we claim is:

1. A light-activated type semiconductor-controlled rectifier device comprising:

a semiconductor substrate including a couple of first and second main surfaces located opposedly to each other, four continuous layers of alternately different conductivity, adjacent ones of said four layers forming a plurality of PN junctions between said two main surfaces, said first main surface including at least the exposed surfaces of a first outer layer and a couple of intermediate layers, said second main surface including at least the exposed surfaces of a second outer layer and an intermediate layer adjacent to said second outer layer;

a first main electrode disposed on said first main surface and in ohmic contact with at least said first outer layer;

a second main electrode disposed on said second main surface and in ohmic contact with said second outer layer and said intermediate layer adjacent to said second outer layer;

means for radiating a photo-trigger signal on that part of said intermediate layer adjacent to said second outer layer which is exposed to said first main surface, said photo-trigger signal firing said device; and means for causing a photo current produced in said intermediate region adjacent to said second outer layer by radiation of said photo-trigger signal to flow along that part of a PN junction between said second outer layer and said intermediate layer adjacent to said second outer layer which is parallel to said second main surface.

2. A light-activated type semiconductor-controlled rectifier device comprising:

a semiconductor substrate including first and second main surfaces opposedly located to each other, a first outer layer, a second outer layer, a first intermediate layer, a second intermediate layer, a third intermediate layer between said first and second intermediate layers, a first PN junction formed between said first intermediate layer and said third intermediate layer, and a second PN junction formed between said second intermediate layer and said third intermediate layer;

said first main surface including the exposed surfaces of at least said first outer layer and of said first intermediate layer adjacent to said first outer layer;

said second main surface including the exposed surfaces of at least said second outer layer and of said second intermediate layer adjacent to said second outer layer;

said five layers being continuously arranged between said first and second main surfaces in such a manner that every adjacent pair of said five layers has different conductivity;

said first and second outer layers defining a couple of four-layer regions having polarities different from each other in the direction of layer lamination;

parts of said first and second PN junctions in proximity to each other being exposed to said first main surface between said four-layer regions;

a first main electrode formed on said first main surface and in ohmic contact with at least said first outer layer and said first intermediate layer except in the vicinity of said exposed portions of said first and second PN junctions;

a second main electrode formed on said second main surface and in ohmic contact with at least said second outer layer and said second intermediate layer; and means for radiating a photo-trigger signal on said exposed portions of said PN junctions of said first main surface for performing the switching operation of said two four-layer regions.

3. A light-activated type semiconductor-controlled rectifier device according to claim 2, further comprising means for causing the photo current produced in the part of said second intermediate layer in the neighborhood of said first main surface by radiation of said photo-trigger signal to flow along that part of the PN junction between said second outer layer and said second intermediate layer which is parallel to said second main surface.

4. A light-activated type semiconductor-controlled rectifier device according to claim 2, in which said second intermediate layer is extended into the whole interface between said two four-layer regions, thereby separating said third intermediate layer into two portions.

5. A light-activated type semiconductor-controlled rectifier device according to claim 4, in which the distance between said portions of said separated third intermediate layers is greater at and in the vicinity of the part of said first main surface radiated with a photo-trigger signal than at the remaining part.

6. A light-activated semiconductor-controlled rectifier device according to claim 4, further comprising an isolating region having a different conductivity from said second intermediate layer, said isolating region being formed in the part of said second intermediate layer in such a manner as to separate said regions, said isolating region being formed along the junctions between said part of said second intermediate layer and said separated portions of said third intermediate layer in such a manner as to separate said second intermediate layer.

7. A light-activated semiconductor-controlled rectifier device according to claim 6, in which that part of said second intermediate layer exposed to said second main surface which is located between said second outer layer and said isolating region and which corresponds to the part of said first main surface radiated with a photo-trigger signal is electrically insulated from said second main electrode.

8. A light-activated semiconductor-controlled rectifier device according to claim 6, in which said isolating region surrounds said two four-layer regions.

* * * * *